United States Patent [19]

Herbert

[11] Patent Number: 4,521,503

[45] Date of Patent: Jun. 4, 1985

[54] HIGHLY PHOTOSENSITIVE AQUEOUS SOLVENT-DEVELOPABLE PRINTING ASSEMBLY

[75] Inventor: Alan J. Herbert, Woodbury, Minn.

[73] Assignee: Minnesota Mining and Manufacturing Company, St. Paul, Minn.

[21] Appl. No.: 609,286

[22] Filed: May 11, 1984

[51] Int. Cl.³ ............................................. G03G 13/28
[52] U.S. Cl. ..................................... 430/49; 430/302; 430/319
[58] Field of Search .......................... 430/49, 302, 319

[56] References Cited

U.S. PATENT DOCUMENTS

| | | | |
|---|---|---|---|
| 2,939,787 | 6/1960 | Giaimo | 96/1 |
| 2,959,481 | 11/1960 | Kucers | 96/1 |
| 3,152,895 | 10/1964 | Tinker et al. | 96/1 |
| 3,248,217 | 4/1966 | Shulman | 96/1 |
| 3,404,979 | 10/1968 | Bonjour | 96/1.8 |
| 3,428,452 | 2/1969 | Giaimo | 96/1.7 |
| 3,507,692 | 4/1970 | Ghys et al. | 117/201 |
| 3,558,544 | 1/1971 | Cole et al. | 260/29.7 |
| 3,582,321 | 6/1971 | Ueda et al. | 96/1.8 |
| 3,585,027 | 6/1971 | Shimizu | 96/1.5 |
| 3,704,122 | 11/1972 | Yamagucki et al. | 96/1.8 |
| 3,725,061 | 4/1973 | Verhille et al. | 96/1.8 |
| 3,923,509 | 12/1975 | Kuehn et al. | 96/1.8 |
| 4,104,072 | 8/1978 | Golda et al. | 96/68 |
| 4,226,930 | 10/1980 | Takimoto et al. | 430/126 |
| 4,401,743 | 8/1983 | Incremona | 430/157 |
| 4,408,532 | 10/1983 | Incremona | 101/456 |

FOREIGN PATENT DOCUMENTS 82104413.8  5/1982  European Pat. Off. .

OTHER PUBLICATIONS

Kitamura and Kokado, P. S. and E., 26, 158 (1982).

*Primary Examiner*—John D. Welsh
*Attorney, Agent, or Firm*—Donald M. Sell; James A. Smith; Lorraine R. Sherman

[57] ABSTRACT

A photoimageable printing assembly comprises:
(a) an electroconductive support, and
(b) a dual layer photosensitive construction comprising
 (1) a photoresist lower layer sensitive to radiation in the wavelength range of 250 to 450 nm, the photoresist being soluble or dispersible in an aqueous solvent only, in either the exposed or unexposed areas and
 (2) a photoconductive upper layer comprising zinc oxide in a water-soluble or water-dispersible binder, the layer being sensitive to radiation above 250 nm, and the layer being dispersible in an aqueous solvent.

The assembly can be useful for making printing plates and printed circuits.

18 Claims, No Drawings

HIGHLY PHOTOSENSITIVE AQUEOUS SOLVENT-DEVELOPABLE PRINTING ASSEMBLY

DESCRIPTION

1. Field of the Invention

The present invention relates to a photoimageable printing assembly. The assembly which has a dual layer photosensitive construction is aqueous solvent-developable and can useful for making printing plates and printed circuits.

2. Background Art

Printing of general commercial literature such as books, catalogues, greeting cards, and business forms utilizes a process known as lithography or planography. In this process the image and nonimage areas are approximately on the same plane, and the difference between image and nonimage areas is maintained by the physicochemical principle that grease and water do not mix. The image area is grease-receptive and water-repellant; the nonimage area is water-receptive and grease-repellent. Therefore, the organic based ink adheres only to the image areas, from which it is transferred to the surface to be printed. The image area in a negative-acting system is provided by polymerization of photoresist which has been struck by light. The unimaged resist is removed when the article is developed leaving the grease-receptive and water-repellent imaged areas of resist.

Bilayer printing plate assemblies comprising an upper photoconductive layer and a lower photoresist layer are known in the art. Such systems are described in a paper by Kitamura and Kokado, P.S. and E., 26, 158 (1982). A first imaging exposure by visible or near UV light gives an electrostatic image on an organic photoconductive layer (metal-free phthalocyanine in a binder) which is then toner developed. A second flash exposure with deeper UV radiation, to which the presensitized plate layer is sensitive, reproduces the toner image in the layer. Finally, application of an aqueous alkali is needed to remove both the photoconductive layer with its toner, and the exposed regions of the photopolymer, providing a litho printing plate.

U.S. Pat. No. 2,939,787 discloses a variation of the above-described system in which the top layer is ZnO is a non aqueous binder and the underlayer is a photoresist layer. The procedure is the same except that toluene is used to remove the photoconductive layer and then warm water is used to remove unhardened areas of photoresist. This is followed by etching of the metal substrate plate. In U.S. Pat. No. 4,226,930 and EPA No. 82-104413.8 the toner mask is produced on an electrographic material separately and then transferred to the presensitized plate surface for flash exposure and development with the required plate developers.

In none of the above-mentioned references can both the photoconductive layer and the underlayer be developed in plain water. In U.S. Pat. No. 2,939,787 a further difference lies in the necessity to etch the metal substrate to make the final printing plate.

Plain water developed presensitized printing plates have been disclosed, for example, in U.S. Pat Nos. 4,401,743, 4,408,532, and 4,104,072.

U.S. Pat. Nos. 3,152,895, 3,507,692, 3,558,544, 3,582,321 and 3,923,509 disclose binders, such as copolymers of vinyl acetate and crotonic acid, amine salts of polyester or terpolymers of methylmethacrylate, butadiene, and styrene which dissolve in water to form coatable compositions.

Photoconductive ZnO formulations in which the binder is water miscible at the preparation and coating stages are well known in the art. Some are water soluble at coating but are cured by heat or otherwise after coating and thus are not then water soluble (U.S. Pat. Nos. 2,959,481 and 3,404,979). Others require the presence in the formulation of free alkali to ensure water solubility (U.S. Pat. Nos. 3,585,027, 3,704,122, and 3,725,061). Still others are prepared as water emulsions of water-insoluble polymers (U.S. Pat. Nos. 3,248,217 and 3,428,452).

SUMMARY OF THE INVENTION

Briefly, the present invention provides a photoimageable printing assembly comprising a support having on at least one surface thereof a dual layer construction. The lower layer of the dual layer construction comprises an aqueous solvent (preferably plain water) developable photoresist and the upper layer comprises a highly sensitive, presensitized, aqueous solvent (preferably plain water) dispersible, photoconductive ZnO-containing layer which when subjected to conventional electrographic procedures involving charging, exposing, and toning can produce a toned image on its surface.

The zinc oxide may be spectrally sensitized with dye so as to be sensitive in the visible or infra-red regions of the spectrum, i.e., in the range of 370 to 1200 nm, preferably 370 to 900 nm. Spectral sensitization in the wavelength region 800–850 nm is of particular interest because this gives a plate usable with laser diode image scanning exposure systems. The upper layer together with the toned image can be washed off in an aqueous-solvent (preferably plain water) bath.

The method of using the printing assembly of the present invention involves two exposures to radiation. An electrostatic image is produced in the zinc oxide layer by standard techniques using a first exposure to an image formed by low intensity visible or near infra-red light. This electrostatic image is then developed with a toner exhibiting high absorption of the radiation subsequently used to expose the photoresist of the lower layer. The toner developer is preferably of the small charge/mass ratio type (normally a liquid toner). The plate is then given a uniform second exposure to high intensity far blue or near UV radiation so that the toner image acts as a mask, thus producing a representation of the original image in the photoresist of the lower layer. Plain water washing removes all the zinc oxide layer and the toner image and at the same time develops the resist layer imagewise giving a negative or positive image depending on the resist material chosen. A subsequent inking step can be employed to provide a lithographic printing plate or an ionizing step to provide a printed circuit.

Such an assembly provides significant advantages to printing technology which include (a) image exposure with visible or infra-red light which is more in keeping with modern electronic imaging and processing techniques than the actinic light used for plate exposure in the past;

(b) lower intensity exposures required in the imaging step of the upper electrographic layer, which can be translated into faster plate making; sensitivities of 100 to 500 ergs/cm$^2$ at its most sensitive wavelengths compare very favorably with conventional printing plates having sensitivities of $10^4$ to $10^5$ ergs/cm$^2$;

(c) plain water plate development, giving all the advantages of ease of use, low cost, low pollution, etc.;

(d) capability of providing at least 50,000 copies when used as a printing plate which is unusual for a high sensitivity printing assembly.

The image provided by the printing assembly can be in the negative or positive mode. The second step preferably is negative-acting and the assembly provdies a negative image.

As used in the present invention:

"photoresist" means a material which upon exposure to actinic radiation, changes its chemical and/or physical properties (e.g., solubility, hardness, etc.) which enables the exposed or unexposed areas to be preferentially removed in a subsequent procedure; in printing plate technology the exposed areas may change in oleophilicity as well as in hardness;

"actinic radiation" includes electromagnetic radiation and electron beam;

"aqueous solvent" means an aqueous solution optionally comprising a water-miscible organic solvent wherein the weight percent of water is at least 50, preferably at least 80, and most preferably at least 90;

"plain water" means distilled water or tap water; and

"water-soluble" or "water-dispersible" means removable in plain water in the chemical and physical environment of the process, preferably at room temperature.

DETAILED DESCRIPTION The present invention provides a photoimageable printing assembly comprising:

(a) an electroconductive support, and (b) a dual layer photosensitive construction comprising:

(1) a photoresist lower layer sensitive to radiation in the wavelength range of 250 to 450 nm, said photoresist being soluble or dispersible in an aqueous solvent only (preferably plain water), either in exposed or unexposed areas, and (2) a photoconductive upper layer comprising zinc oxide in a water-soluble or water-dispersible binder, said layer being sensitive to radiation above 250 nm, preferably in the range of 370 to 1200 nm, most preferably 370 to 900 nm, and said layer being dispersible in an aqueous solvent (preferably plain water).

The support for the dual layer construction of the present invention is electroconductive or has an electroconductive surface layer. It can be metal, nonmetal or polymeric materials. In printing plate technology it can be of any of the materials known in the art for lithographic plates as long as they are electroconductive. Metals including copper, iron, and preferably aluminum with or without surface treatments or overlaid with other metals (e.g. chromium) are most commonly used and are preferred here. However, plastics with an electroconductive surface coating may be used including polyesters, polycarbonates, polyacetates, etc. Conductive paper may also be used as a support. Plastics which are themselves electroconductive may also be used.

The lower photoresist layer may be chosen from those classes exhibiting a change from solubility in water to insolubility in water together with exhibiting oleophilic properties when exposed to actinic light (UV/blue in the wavelength range 250–450 nm). Examples of such photosensitive resin lower layers are water-soluble materials such as polyvinyl pyrrolidone (PVP), polyvinyl alcohols, polyacrylamides and copolymers thereof, synthetic gums such as starabic, dextrines, natural gums such as gum arabic and hydroxyethyl cellulose gum. Photosensitive are desirably included with the water-soluble binder in the lower layer composition in the ratio of photosensitizer to resin in the range of 100:1 to 1:100 parts by weight.

Particularly useful lower photoresist layers are selected from:

(a) an adduct derived from a combination of a diazo resin having a plurality of pendant diazonium sites with a polymer having a plurality of sulfonated groups (e.g. sulfonated polyesters) disclosed in U.S. Pat. Nos. 4,408,532 and 4,401,743; and (b) a bilayer disclosed in U.S. Pat. No. 4,104,072 and comprising (i) a bottom layer which comprises water-soluble, minimally or non organic-solvent soluble, lithographically suitable photo-sensitizer which may or may not be mixed with a water-soluble resin, as disclosed in U.S. Pat. No. 4,104,072. Water-soluble photosensitizers employable as part of the invention include:

4-diazo-diphenylamine sulfate 1-diazo-4-N,N-dimethylamino-benzene zinc chloride 1-diazo-2,5-diethoxy-4-morpholino-benzene-borofluoride 2-diazo-1-naphthol-5-sulfonic acid, sodium salt 1-diazo-4,N,N-diethylamino-benzene, borofluoride 1-diazo-2,5-diethoxy-4-p-tolylmercaptobenzene ½ zinc chloride 1-diazo-3-ethoxy-4-N-methyl-N-benzylaminobenzene, ½ zinc chloride 1-diazo-3-chloro-4-N,N-diethylaminobenzene, ½ zinc chloride 1-diazo-3-methyl-4-pyrrolidino-benzene chloride zince chloride 1-diazo-3-methyl-4-pyrrolidino-benzeneborofluoride 1-diazo-2-chloro-4-N,N-dimethylamino-5-methoxybenzene, borofluoride 1-diazo-3-methoxy-4-pyrrolidino benzene, zinc chloride condensation product of 4-diazo-diphenylamine sulfate and formaldehyde zinc chloride, and (ii) a top coating comprising a water-permeable oleophilic resin and a water-insoluble photosensitive composition.

Water-permeable oleophilic resins usable in the top coating include, epoxy resins (such as Epon TM 1031, 1001-1009, Shell Oil Company); polyurethane (such as Goodrich's Estane TM Series 5714, 5715); polyester (for example, DV 521 available from Polychrome Corp.); Formvar TM (such as 12/85 available from Monsanto); urethanes of low molecular weight (such as DV 53, Dv 532 available from Polychrome Corp.); butyrl resins (commercially available product of Mansanto); Polyox TM (polyethylene oxide series, available from Union Carbide); and polyvinyl hydrogen phthalate. The water-insoluble photosensitive compositions which may be satisfactorily employed in forming the top layer of the bilayer of the invention disclosed in U.S. Pat. No. 4,104,072 are those which are lithographically suitable and are sensitive to ultraviolet light. The photosensitive compositions which may be used as part of this invention are those which are negative or positive acting and include such negative acting photosensitive agents as the aromatic diazo compounds such as the reaction product of paradiazo diphenylaminepara-formaldehyde condensate and 2-hydroxy-4-methoxy benzophenone sulfonic acid; and the azidopyrenes, for example, 1-acido-pyrene, 6-nitro-1-azidopyrene, 1,6-diazidopyrene, 1,8-diazido-pyrene, 1-propionyl-6-azidopyrene, 1-acetyl-6-azidopyrene, 1-n-butyryl-6-azidopyrene. 1-n-pronionyl-8-bromo-6-azidopyrene; and 8-n-propionyl-1,6-diazidopyrene; and such positive acting photosensitive agents as aromatic diazo-oxide compounds, for example, benzoquinone diazides, nathtoquinone diazides, and polyacetals which depolymerize under ultraviolet radiation, polymonochloroacetaldehyde, polypropionaldehyde, poly-n-butyraldehyde, poly-cyanoacetaldehyde, poly-B-cyanopropionaldehyde, polycyano-pentaldehyde, poly-cyanovaleraldehyde, poly-isobutyraldehyde, poly-valeraldehyde, poly-heptaldehyde; and (c) a bilayer presensitized plate coating as disclosed in Assignee's copending patent application, U.S. Ser. No. 537,828 filed Sept. 30, 1983 which is developable by an aqueous solution of benzyl alcohol. This lower layer comprises a coating of diazonium resin and the upper layer comprises a sulfopolyester.

The above-described prior art coatings are useful in whole or in part as the lower layer of the dual layer construction of the present invention. These layers may be solvent coated onto the support by any of the known techniques, e.g., knife, wire wound bar, slot, dip trough, spray. Solvents employable with components (a) include dimethyl formamide, 2-methoxyethanol, γ-butyrolactone, N-methylpyrrolidinone, and those for components (b) include methanol, ethanol, isopropyl alochol, acetone, methyl ethyl ketone, and methyl cellosolve. Dry coating weights can range from about 0.2 to 20 g/m².

The proper working of a zinc oxide/binder electrographic layer for imaging requires that the layer immediately beneath it be sufficiently conductive to allow rapid dissipation of charge in exposed areas. The lower layers of the dual layer construction of the present invention provide a combination of low thickness with suitable, although low, bulk conductivity to satisfy this requirement as evidenced by practical measurements described under "Evaluation of the Photoconductive Layers" below.

A plate having as its lower layer a positive-acting plate can be made by the process of this invention, using positive plate stock in place of the negative material. On coating the zinc oxide overlayer, the assembly is dried and incubated as before, and is processed in a similar manner. The finished plate can be subjected to all the post-processing techniques used with positive plates, e.g., a bake step may be included to increase the press life. Also, positive-acting zinc oxide photoconductive formulations which are known in the art can be used in the practice of this invention.

The photoconductive upper layer of the present invention comprises photoconductive zinc oxide dispersed in a water-removable (water-soluble or water-dispersable) binder. Zinc oxides suitable for photoconductive layers are well known in the art and consist of relatively small particles (0.1 to 0.5 micrometers means diameter). Zinc oxide may be supplied under a variety of trade names such as USP TM 19, Photox TM 80, and Photox TM 90 (all from New Jersey Zinc).

The zinc oxide particles are dispersed in the chosen binder in the ratio of 2:1 to 20:1, preferably 5:1 to 10:1, pigment to binder by weight, with suitable solvents preferably using high shear blenders although ball milling may be used. The water-removable binders may be chosen from a wide range of classes disclosed in the art for use with photoconductive zinc oxide (U.S. Pat. Nos. 3,152,895, 3,507,692, 3,558,544, 3,582,321, and 3,923,509). These include copolymers of vinyl acetate and crotonic acid, terpolymers of methylmethacrylate, butadiene, and styrene, and amine salts of polyesters. However, it has been found that the preferred binder for the present invention comprises polyvinyl pyrrolidone (PVP). Other binders may be blended with this but concentrations of at least one part of PVP to one part by weight of the combined other binders preferably is present to retain water removability. Thus binders which may be added include low molecular weight polystyrene, hydroxypropylated cellulose, polymethacrylates, polyacrylates and polymers soluble in chloroform (in which PVP is soluble).

Coating of the zinc oxide binder layer is made from solution in water, polar organic solvents, or chloroform using known coatinig techniques (knife, wire wound bar, slot, dip trough). Sensitizing dye may be added before coating. It has been found that the final charge acceptance voltage (CAV) of the photoconductive layer is substantially increased by elevated temperature treatment immediately following the drying of the coated layer. A treatment at about 60° C. for 30 minutes is particularly advantageous in ensuring high CAV and thus high toner image densities.

Spectral sensitization of photoconductive zinc oxide/binder formulations is well known in the art both for the visible and the near infra-red regions of the spectrum (370 nm to 1200 nm). Thus dyes for the visible region are disclosed in U.S. Pat. Nos. 3,121,008, 3,630,749, 3,702,767, 3,881,638, and 4,028,353. Dyes for the near infra-red are disclosed, for example, in U.S. Pat. Nos. 3,619,154 and 4,362,800.

The initial stage in the preparation of a printing plate is the image-wise exposure of the negatively-charged photoconductive layer using normal electrographic techniques of corona charing and projected image or scanning exposure with low intensity visible or IR radiation. The resultant electrostatic image is toner developed by either liquid or dry toners, preferably liquid toners, in which the pigmented particles are chosen to be absorbing of the actinic light to be used in the second stage of the preparation. Suitable pigments include carbon black, Mapico TM black (columbian Carbon Co.), Nigrosine TM (GAF), Grassol TM black (Geigy Co. Inc.), Pigment Yellow LX Cyb TM 340 (Max Factor) etc. The toner particles do not need to be "fixed" to the plate surface by heat or lacquer treatments—in fact it is inadvisable to do so. The toner does not have some of the requirements of more permanent toned images. Table I gives a representative processing sequence.

TABLE I

| Processing Sequence | | |
|---|---|---|
| Step | Time | Comment |
| charge (negative) | 10 sec | 6000 volt corona |
| expose | 1/500 sec | Xenon flash + #87 filter at 39 cm.* |
| tone | 20 sec | Gould TM 5000/5100 Toner |
| rinse | 5 sec | hexane |
| dry | 10 sec | in air |
| re-expose | 90 sec | Colite TM arc frame |
| dev. & finish | 60 sec | warm water |

*While exposure to laser diode radiation has been demonstrated, the Xenon flash has proved the most convenient source.

Zinc oxide has high natural absorption in the wavelength region below 400 nm. It therefore acts as a uniform absorber to the second exposure actinic to the photopolymer layer and thus increases the required exposure. If this photopolymer is chosen to be activated by radiation of wavelength slightly longer than 400 nm this effect is minimized. Any overlap of the wavelength band of the first (imaging) exposure onto the band of the second uniform exposure is no real problem because the first exposure is much less intense than the second, typically 2 or 3 orders of magnitude less.

Preparation of two photoresist layers (photopolymers A and B), used in the Examples are described below, together with evaluations of their properties.

Preparation of a plain water-developable photopolymer layer A

A photoreactive composition was formulated by sequentially mixing ingredients as follows:

| | |
|---|---|
| polyallylorthophthalate prepolymer (having the structure* shown below) as a 25 weight % solution in methylethyl ketone | 363 g |
| polyvinylpyrrolidone as a 7 weight % solution in ethyleneglycol monomethyl ether | 590 g |
| pentaerytritol tetraacrylate | 68.75 g |
| cellulose acetate butyrate | 2.5 g |
| polyurethane resins** (having repeating units shown below) as a 10 weight percent solution in dimethylformamide | 179 g |
| 2(p-methoxystryl)4,6-bis(trichloromethyl)-s-triazine | 5.5 g |
| fluoroborate salt of the condensation product of paraformaldehyde and p-diazo diphenylamine | 16.5 g |
| yellow oil soluble dye | 1.4 g |
| dispersion of 18 weight percent Microlith Blue 4GK dye in methylethyl ketone (a copper phthalocyanine pigment) | 168 g |

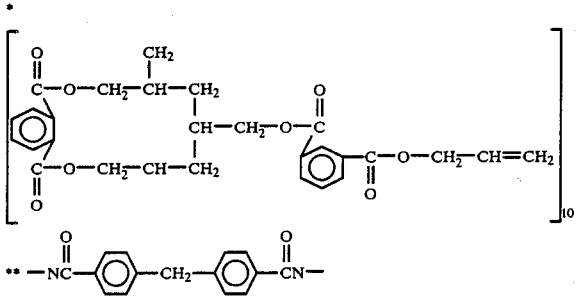

After homogeneous mixing of these compositions, the final solution was reduced to 8 weight percent solids by the addition of 250 g methylethyl ketone, 500 g dimethylformamide and 1293 g of ethyleneglycol monomethyl ether.

The pigment dispersion in this and other examples was 60 weight percent pigment in 40 percent vinyl copolymer comprising 86 percent units derived from vinylchloride and 14 percent units derived from vinyl acetate.

A lithographic support plate structure for use in the examples was prepared according to the example in U.S. Pat. No. 2,714,066. A smooth surfaced aluminum sheet was washed with trisodium phosphate, then treated with a nitric acid solution and rinsed in water. The sheet was then treated with an aqueous silicate solution and washed clean of any remaining water-soluble material. An initially water-soluble, light sensitive resin, p-diazodiphenylamineformaldehyde resin as a 2.5 percent aqueous solution, was then coated over the silicate treated surface. A dry coating weight of 120–140 mg/ft$^2$ of the above prescribed photoreactive composition was then applied and air dried at 71°–88° C.

Preparation of aqueous benzyl alcohol developable photopolymer layer B

Into a 500 ml 3-neck flask equipped with a stirrer, thermometer, reflux column, and means for maintaining an atmosphere of nitrogen over the contents of the flask, were placed 136.2 g (0.92 mole) phthalic anhydride, 21.1 g (0.08 mole) 5-sulfoisophthalic acid monosodium salt, 124 g (2.0 moles) ethylene glycol, 8.4 g antimony trichloride, and 1.09 g sodium acetate. While stirring, the mixture was heated to 193° C. and held at this temperature for 4 hours. The reflux column was then replaced with a vacuum distilling head, a vacuum line was attached, and over a period of 0.5 hour the pressure reduced to less than 1.0 torr and the temperature of the reactants increased to 250° C. These conditions were maintained for 2.5 hours, after which the reaction product, a sulfopolyester, was discharged hot from the reaction flask as a honey-like resin containing 46 mole percent of components having carbonyl groups on ortho positioned carbon atoms (92 moles of o-dicarboxylic acid per 100 moles of all dicarboxylic acids). The sulfopolyester (designated sulfopolyester Z) had a sulfo equivalent weight of 2,500 and inherent viscosity of 0.17 in dimethyl formamide, a glass transition temperature, Tg, of 50° C., and a molecular weight (determined by a light scattering procedure) of about 20,000. No evidence of crystallinity was observed by differential scanning colorimetry in samples annealed at 100° C. for 48 hours.

Five grams of the amorphous sulfopolyester Z (containing 2.0 milliequivalents of sulfo group) were dissolved in water and diluted to 1.0 percent solids. The solution was cooled to 10° C. and added dropwise while stirring to 64 ml of a one percent aqueous solution (2.0 meq) of the zinc chloride double salt of the formaldehyde condensation product of p-diazodiphenylamine (designated diazonium resin A). A tan, finely divided solid percipitate was obtained immediately that was filtered, washed with water and dried. The precipitate could be stored for later use or immediately dissolved and coated.

A coating solution was prepared by mixing:

| | Parts by weight |
|---|---|
| adduct of 1:1 equivalents of sulfopolyester Z and diazonium resin A | 1.0 |
| Victoria Blue dye (duPont) | 0.2 |
| 1,2-dichloroethane | 19.0 |

The solution was coated at about 1 g/m$^2$ dry solids over a silicated aluminum sheet which has been previously sensitized with diazonium resin A at a coating weight of about 0.1 g/m$^2$.

The plates may be exposed to ultraviolet radiation through a stencil and developed with water containing 3.5 percent by weight benzyl alcohol, 2.0 percent by weight ammonium sulfite and 2.0 percent by weight sodium allyl naphthalene sulfonate.

Evaluation of the Photoconductive Layers

In addition to the evaluations carried out on the bilayer plates which resulted in printing plates capable of final direct evaluation, the following evaluation was carried out on many samples to investigate the photoconductive layer properties explicitly.

Coatings were evaluated electrophotographically by means of an apparatus that corona charged a sample (−7,500 volts) for 4 seconds, placed the sample under a Monroe Isoprobe, in darkness, and then, after 2 seconds exposed the sample to radiation. The light source was a tungsten bulb, with a series of interference filters for the appropriate wavelength. Standard incident radiance (when VOC TM type paper (3M) was used) was 100 erg/cm$^2$/sec (some of the slower coatings required an increase in this value to obtain reasonable decay curves). Surface potential was plotted against time on a y-t (displacement-time) recorder. The graph showed a falling potential as the time of exposure increased.

Two parameters were normally measured from these curves, the Charge Acceptance Voltage (CAV) and the photographic speed corresponding to a point on the curve where the voltage had fallen to half the voltage V at the beginning of the exposure. V was normally less than CAV because of dark decay. The exposure time $t_\frac{1}{2}$ to the V/2 point was used as a measure of photographic speed.

Calibration was performed using a U.D.T. (United Detectors Technology, Inc., Santa Monica, CA) 81 Optometer Probe placed underneath the sample holder aperture, and from the readings, exposure values in ergs/cm$^2$ were related to the $t_{1/8}$ value. Speed values, S, were calculated where S equals log (cm$^2$/erg) for the $t_{1/8}$ condition.

Objects and advantages of this invention are further illustrated by the following examples, but the particular materials and amounts thereof recited in these examples, as well as other conditions and details, should not be construed to unduly limit this invention.

EXAMPLE 1

A zinc-oxide dispersion was prepared as follows:

| Formulation I | |
|---|---|
| ethanol | 56 mL |
| polyvinyl pyrrolidone (MCB Manufacturing Chemists Inc. K15 10,000 MW) | 8 g |
| Photox 80 (a photo grade zinc oxide, New Jersey Zinc Co., Inc. Palmerton, PA) | 52 g |

This dispersion was ball-milled for 4 hours, and to a 10 g portion, 1 mL of 1:1000 w/w IR-125* in methanol added. The whole was shaken thoroughly to ensure dispersion of the dye. The dispersion was coated at 50 micrometer wet thickness on aqueous plate material of type A above and dried.

*IR-125 (see Eastman Data Service Publication JJ-169 "Laser Products", Eastman Kodak Co., 1969) is a Kodak Q-Switch laser dye of formula:
Anhydro-1,1-dimethyl2-7-1,1-dimethyl-3-(4-sulfobutyl)-2-(1H)-benz-(e)indolinylidene-1,3,5-heptatrienyl 3-(4-sulfobutyl)-1H-benz(e)indolium Hydroxide Sodium Salt: "AIR-125".

a. Processing consisted of charging the surface, exposing to an infrared flash source through a U.S. Air Force bar target, development in Scott System 200 toner for 20 seconds, 2 minutes exposure in a Colite TM arc frame, and plain water development. A good image of a U.S. Air Force bar target was obtained.

b. Aqueous plate material of type A can be coated on an elemental silicon substrate and overcoated with the photosensitive, removeable, zinc oxide dispersion described immediately above, and processed according as in EXAMPLE 1a. The result is a hardened resist in the areas originally struck by light, which can then be used to preferentially dope (implant ions in trace amounts) the silicon substrate. This provides a resist for making an integrated circuit.

EXAMPLE 2

Zinc oxide dispersion

| Formulation II | |
|---|---|
| isopropanol | 56 mL |
| polyvinyl pyrrolidone (MCB K15, average molecular wt. 10,000) | 10 g |
| Photox 80 zinc oxide | 52 g |

The PVP was dissolved in the ispropanol in an 200 mL jar, the zinc oxide added plus fifty 1.25 cm glass balls. The jar was capped, taped and ball-milled overnight.

For coating, 10 g of the above dispersion was mixed with 0.5 mL IR-125 solution (4 mg/mL in methanol), plus 1.5 mL methanol, and the whole diluted to twice its volume with aqueous isopropanol. It ws coated with a No. 14 coating rod (32.0 micrometers) on aqueous plate material A. After air drying, the material was baked at 60° C. for about 1 hour and then was bagged and allowed to dark adapt.

While detailed results are reported for only one material general results are given for similar materials with different coating weights and different dye concentrations.

The variables evaluated were line resolution, CAV, speed, dot resolution, and toner type.

Table II gives the general results of varying certain parameters, namely effect of thickness of ZnO top layer (including no top layer).

TABLE II

Resolution characteristics - various constructions

| Construction | Observed resolution (cycles/mm) | Comment |
|---|---|---|
| Photopolymer A alone | 45 average (72 highest) | Considerable variation was observed-probably caused by processing technique. |
| Photopolymer A with ZnO topcoat | 20–30 10 | For coating less than 25 micrometers wet 40 micrometers wet coating. Both the above are for a target contact printed on the material at a "Solid 6" exposure level. |
| Photopolymer A with ZnO topcoat | 20 | From an infrared exposed, toned image. |

Additional results were:

(a) Charge acceptance voltage (CAV) increased with increasing coating weight. This effect has been observed with other systems, although better linearity was achieved here (CAV determines toner deposition density).

(b) CAV remained constant with increasing dye/ZnO ratio, a surprising result because normally it falls with increasing dye. Taken in conjunction with speed information, this was a useful finding.

(c) Sensitivity to light increased with layer thickness.

(d) As more dye was added, sensitivity increased until self-filtration limited further sensitivity increase.

(e) It was desirable to have as short a reexposure as possible (economy, time, etc.). The thickness of the zinc oxide overcoat was a basic determinant of this time because it absorbed light. Zinc oxide absorbed strongly in the ultraviolet (typical density ws 0.6 to 365 nm) and this affected the needed exposure of the underlying plate material. Density was determined by step tablet exposure of samples having varying zinc oxide coating thicknesses.

(f) Speed Measurement—Sensitivity to 800 nm radiation was measured, using the electrophotographic test apparatus, and found to be about 400 ergs/cm². Higher speeds could be achieved at the expense of other properties.

(g) Dot Resolution—A half tone screen was contact printed on the coating and processed as in Table I. All 3 percent dots were resolved for 25.6 to 59 lines/cm (65 to 150 lines/inch) and all 95 percent dots were resolved. The material failed on 97 percent dots.

(h) The effect of using different toners and their varying densities in relation to second exposure light on two samples of the same coating was evaluated and found to be useful.

EXAMPLE 3

The effect of heat treatment on the ZnO/binder coated layers was evaluated.

| Formulation III | |
|---|---|
| polyvvinylpyrrolidone (PVP) K15 (MCB Chemicals, av. m. wt. 10,000) | 4.0 g |
| PVP K90 (MCB Chemicals, av. m. wt. 360,000) | 1.0 g |
| isopropanol | 56 mL (43.3 g) |
| dissolve PVP in Virtis ™ blender and add ZnO (Photox 80) disperse for 10 minutes. | 26 g |

A sample (1) was coated at 100 micrometers wet thickness on conductive paper. After the addition of 1 mL of a 1 weight percent solution of bromophenol blue in methanol to 10 g of Formulation III, a second sample (2) was coated at 100 micrometers wet thickenss (0.38 g/dm²) on aluminum. Both samples were air dried and were evaluated for CAV before and after a heat treatment of 60° C. for the time indicated. The coated layer washed off successfully in plain water.

| Sample | CAV before | CAV after heat treatment | Time in min |
|---|---|---|---|
| 1 | 10 | 120 | 30 |
| 2 | 40 | 120 | 30 |
| 2 | 40 | 295 | 600 |

A low CAV is often a problem with water dispersed or water dispersible ZnO formulations. The results show that the heat treatment produced usable coatings. The long heat treatment on Sample (2) gave the CAV expected of a toluene based formulation at that coating weight.

EXAMPLE 4

The use of a non-polar solvent was tested.

| Formulation IV | |
|---|---|
| PVP K15 | 4.0 g |
| PVP K30 (MCB Chemicals, av. m. wt. 40,000) | 1.0 g |
| were dissolved in chloroform | 56.0 mL |
| and added ZnO (Photox 80) | 26.0 g |

To a 10 g sample of this formulation bromophenol blue sensitizing dye was added to the amount of 0.5 mL of a one weight percent solution in methanol.

This formulation was coated on conductive paper at a wet thickness of 75 micrometers (Sample (30)) and air dried. The coated layer was found to wash off successfully in plain water.

EXAMPLE 5

The effect of binder/ZnO ratio was examined because the binder conductivity is known, to determine the optimum ratio when water dispersible binders are used.

A diluted binder was made from 10.0 g PVP K15 added to 40 mL isopropanol and used in the samples below. Sufficient isopropanol was added to give all the samples equal concentrations of ZnO. They were coated at 100 micrometers wet thickness and air dried overnight, and then measured for CAV with no heat treatment and two different times of heat treatment at 60° C. The data is shown in Table III.

TABLE III

| | | Additions in g to 5.0 g of formulation III | | Weight of binder in 10 g (binder ZnO) | CAV | | |
|---|---|---|---|---|---|---|---|
| Sample | Coating weight g solids per dm² | Isopropanol | PVP diluent | | No heating | 30 min. | 7 hours |
| 4 | 0.24 | 2.00 | 0.0 | 0.67 | 75 | 132.5 | 175 |
| 5 | 0.25 | 1.75 | 0.25 | 0.72 | 59 | 111.5 | —* |
| 6 | 0.27 | 1.50 | 0.50 | 0.77 | 47.5 | 106.5 | 142.5 |
| 7 | 0.27 | 1.00 | 1.00 | 0.87 | 32.5 | 90.0 | 110.0 |
| 8 | 0.31 | 0.0 | 2.00 | 1.07 | 10.0 | 95.0 | 127.5 |

*defective measurement.

The data of Table III show:

(a) increasing binder/ZnO ratio gives decreasing CAV (b) heat treatment after coating and drying gives increasing CAV at all binder ratios.

EXAMPLE 6

Effect of additions of other polymers to Formulation I

The following formulation was used so that the total polymer content was reasonably constant and similar to Formulation I.

| Formulation V | |
|---|---|
| PVP K15 | 3.0 g |
| PVP K90 | 1.0 g |
| isopropanol | 43.3 g |
| ZnO (Photox 80) dispersed in Virtis blender for 10 mins. | 26.0 g |
| Bromophenol Blue - 1 weight percent in methanol | 2.0 mL |

Seven samples were made by addition of different polymers to Formula V. The data is shown in Tables IV and V below.

TABLE IV

| Sample | Additive | g added |
|---|---|---|
| 9 | isopropanol | 2.0 |
| 10 | polymethylmethacrylate (PMMA) Tg 45° C., 10% by weight solution in 1:3 methyl ethyl ketone (MEK)/toluene | 2.0 |
| 11 | PMMA Tg 45° C., 10% solution in chloroform | 2.0 |
| 12 | **Saran ™ F 310 (Vinylidene chloride/ acrylonitrile copolymer) 15% in MEK | 1.3 |
| 13 | **Tyril ™ 880, 10% solution in MEK | 2.0 |

TABLE IV-continued

| Sample | Additive | g added |
|---|---|---|
| 14 | Polystyrene, 20% solution in 1:3 MEK/Toluene | 1.0 |
| 15 | **Klucel ™ E (hydroxypropyl cellulose) 10% by weight in isopropanol | 2.0 |

**Saran Resin F310 available from Dow Chemical Co.; Tyril 880 available from Dow Chemical Co., Klucel E available from Hercules Inc.

Samples 12, 13, and 14 gave precipitated polymer and were remade using chloroform based formulation from Example 4.

TABLE V

| Sample | Formulation VI |
|---|---|
| 16 | 1.0 g 15% by weight Saran F 310 in MEK |
| 17 | 5 g Formulation IV + 1.0 g Tyril 880 |
| 18 | 0.5 g polystyrene + 0.5 g chloroform |

The samples were coated at 100 micrometers wet thickness on conductive paper and aluminum sheet and air dried and given heat treatment of 60° C. for 30 mins.

TABLE VI

| Property | 9 | 10 | 11 | 12 | 13 | 14 | 15 | 16 | 17 | 18 |
|---|---|---|---|---|---|---|---|---|---|---|
| conductive paper coating | OK | NG | NG | OK | NG | NG | OK | OK | OK | OK |
| aluminum plate coating | OK | — | — | — | — | — | OK | OK | OK | OK |
| washing off in plain water | OK | — | — | — | — | — | OK | OK | OK | OK |

CAV measurements were carried out on the successful coatings.

TABLE VII

| Sample | CAV |
|---|---|
| 9 | 132.5 |
| 15 | 124 |
| 16 | 225 |
| 17 | 45 |
| 18 | 206 |

Samples 16 and 18 show high CAV values (using additions of Saran and polystyrene respectively). They were repeated below. The data is shown in Tables VI and VII.

TABLE VIII

| | Formulation | |
|---|---|---|
| Constituents | VI | VII |
| PVP K15 | 2.0 g | 2.0 g |
| PVP K90 | 1.0 g | 1.0 g |
| Saran F310 | 2.0 g | 0.0 g |
| polystyrene | 0.0 g | 2.0 g |
| chloroform | 56 mL | 56 mL |
| ZnO (Photox 80) | 26 g | 26 g |

The polymers did not dissolve completely in Formulation V which was then remade with the following constitution.

| | Formulation VII | |
|---|---|---|
| Part A | PVP, K15 | 2.0 g |
| | PVP, K90 | 1.0 g |
| | chloroform | 28.0 mL |
| Part B | Saran F310 | 2.0 g |
| | MEK | 28.0 mL |

Parts A and B were dissolved independently and then mixed and then 26 g ZnO, Photox 80 was added with 10 mins. blending. However, separation of the polymer occured again.

Formulation VII was coated on conductive paper at 75 micrometers wet thickness and with the following additions.

TABLE IX

| Sample | Coating |
|---|---|
| 19 | Formulation VII |
| 20 | 5 g Formulation VII with the addition of 0.25 g of 1 weight percent solution of Bromophenol Blue in methanol |
| 21 | 10 g Formulation VII with 0.1 g of weight % solution of Bromophenol Blue in methanol, and with 2.5 g of 20 weight percent polystyrene in MEK/toluene (1:3) |

These coatings were successful but no CAV measurements were made.

EXAMPLE 7

Investigation of bilayers

This consists of an aluminum plate coated with a layer of a sulfonated polyester adduct on top of a further layer composed of diazonium resin A as in photopolymer layer B.

For the ZnO photoconductive layer of these plates an isopropanol based formulation (see Example 2) was used because chloroform removed the plate coatings. 75 g of Formulation III was used with the addition of 5 ml of a 0.1 weight percent solution of Bromophenol Blue in methanol. This was then coated onto the type B plate (coated side) using two coating weights each on wirewound bar coater and a knife coater (No. 8 and No. 20 wire wound bars giving 18 micrometers and 46 micrometers wet thickness, and knife coating thickness of 50 micrometers and 100 micrometers). The coatings were air dried and heat treated for 30 mins. at 60° C. Exposures to light of 600 nm wavelength at 267 erg/cm$^2$/sec were carried out in an electrographic tester as described earlier giving the results in Table 10.

TABLE 10

| Sample | CAV | Dark decay % per sec. | $t_{\frac{1}{2}}$ sec. | Speed in $10^{-3}$ cm$^2$/erg |
|---|---|---|---|---|
| 22 | 147 | 8.6 | 1.45 | 2.58 |
| 23 | 193 | 14.1 | 0.81 | 4.61 |
| 24 | 169 | 14.6 | 0.83 | 4.55 |
| 25 | 166 | 17.9 | 0.54 | 6.94 |

Exposure of these samples on a Colite ™ arc frame for 4 min. through a Stouffer ™ step tablet followed by washing in the aqueous developer gave standard results with the 6th step just exposed. Both the removal of the ZnO/binder layer and the development of the photopolymer layers in plain water was readily accomplished.

Various modifications and alterations of this invention will become apparent to those skilled in the art without departing from the scope and spirit of this invention, and it should be understood that this invention is not to be unduly limited to the illustrative embodiments set forth herein.

I claim:

1. A photoimageable printing assembly comprising:
   (a) an electroconductive support, and
   (b) a dual layer photosensitive construction comprising
      (1) a photoresist lower layer sensitive to radiation in the wavelength range of 250 to 450 nm, said photoresist being soluble or dispersible in an aqueous solvent only, in either the exposed or unexposed areas, and
      (2) a photoconductive upper layer comprising zinc oxide in a water-soluble or water-dispersible binder, said layer being sensitive to radiation above 250 nm, and said layer being dispersible in an aqueous solvent.

2. The assembly according to claim 1 which is plain water developable.

3. The assembly according to claim 1 wherein said aqueous solvent comprises at least 80 weight percent water.

4. The assembly according to claim 1 wherein said aqueous solvent comprises at least 90 weight percent water.

5. The assembly according to claim 1 wherein said support is selected from the group consisting of metals, nonmetals, polymeric or paper materials.

6. The assembly according to claim 1 wherein said photoresist layer comprises a binder selected from the group consisting of polyvinyl pyrrolidone, polyvinyl alcohols, polyacrylamides and copolymers thereof, and natural gums.

7. The assembly according to claim 1 wherein said photoresist layer comprises an adduct derived from a combination of a diazo resin having a plurality of pendant diazonium sites with a polymer having a plurality of sulfonated groups.

8. The assembly according to claim 1 wherein said photoresist layer comprises a bilayer comprising a bottom layer having a water-soluble photosensitizer therein and a top layer comprising a water-permeable oleophilic resin and a water-soluble photosensitive composition.

9. The assembly according to claim 1 wherein said zinc oxide is dispersed in a binder selected from at least one of polyvinyl pyrrolidone, copolymers of vinyl acetate and crotonic acid, terpolymers of methylmethacrylate, butadiene, and styrene, amine salts of polyesters, polystyrene, hydroxypropylated cellulose, polymethacrylates, polyacrylates, and polymers soluble in chloroform.

10. The assembly according to claim 9 wherein at least 50 weight percent of said binder is polyvinyl pyrrolidone.

11. The assembly according to claim 1 in which said zinc oxide is dye sensitized to a wavelength band peaking in the range of 370 nm to 1200 nm.

12. The assembly according to claim 11 wherein said peak sensitivity wavelength is in the range of 370 nm to 900 nm.

13. A process of preparing a lithographic printing plate comprising:
   (a) an electroconductive support, and
   (b) a dual layer photoconductive construction comprising
      (1) a photoresist lower layer sensitive to radiation in the wavelength range of 250 to 450 nm, the unexposed areas of said photoresist being soluble or dispersible in an aqueous solvent, and
      (2) a photoconductive upper layer comprising zinc oxide in a water-soluble or water-dispersible binder, said layer being sensitive to radiation above 370 nm, and said layer being sensitive to radiation above 370 nm, and said layer being dispersible in an aqueous solvent;
   said process comprising the steps of:
   (1) negatively charging said photoconductive layer using electrophotographic techniques,
   (2) image-wise exposing said charged photoconductive layer first with low intensity visible or IR radiation to which said zinc oxide is sensitive,
   (3) toner developing the resulting electrostatic charge image,
   (4) uniformly exposing the entire toned surface to a second, high intensity, radiation to which the photoresist is sensitive and which is absorbed by the toner, for a time sufficient to polymerize said photoresist in exposed areas,
   (5) washing with an aqueous solvent to remove the toner, the zinc oxide layer, and the unexposed photoresist, to provide a lithographic plate image equivalent to the original image.

14. The process according to claim 13 wherein said aqueous solvent is plain water.

15. The process according to claim 13 wherein said aqueous solvent comprises benzyl alcohol, a surfactant, and a desensitizing agent.

16. The process according to claim 13 wherein said first exposure is by means of a scanner laser.

17. The assembly according to claim 1 which is a lithographic printing plate.

18. The assembly according to claim 1 which is a printed circuit.

* * * * *